United States Patent
Amemiya et al.

(10) Patent No.: US 6,958,618 B2
(45) Date of Patent: Oct. 25, 2005

(54) TRANSPORTING MECHANISM, MOVABLE PROBE CARD TRANSPORTING APPARATUS USING TRANSPORTING MECHANISM, AND PROBER

(75) Inventors: Hiroshi Amemiya, Nirasaki (JP); Koji Kawaguchi, Nirasaki (JP); Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/742,905

(22) Filed: Dec. 23, 2003

(65) Prior Publication Data

US 2004/0183525 A1 Sep. 23, 2004

(30) Foreign Application Priority Data

Dec. 27, 2002 (JP) .......................... 2002-379041

(51) Int. Cl.[7] .......................... G01R 31/02; G01R 31/28
(52) U.S. Cl. ...................... 324/758; 324/158.1; 324/754
(58) Field of Search ............................ 324/758, 158.1, 324/754, 765; 414/222.01, 222.04, 222.05, 331.1, 331.11

(56) References Cited

U.S. PATENT DOCUMENTS

| 4,803,373 | A | | 2/1989 | Imamura et al. | |
|---|---|---|---|---|---|
| 4,836,733 | A | | 6/1989 | Hertel et al. | |
| 5,049,029 | A | | 9/1991 | Mitsui et al. | |
| 5,254,939 | A | * | 10/1993 | Anderson et al. | 324/754 |
| 5,444,386 | A | * | 8/1995 | Mizumura | 324/754 |
| 5,528,158 | A | * | 6/1996 | Sinsheimer et al. | 324/758 |
| 5,640,100 | A | * | 6/1997 | Yamagata et al. | 324/754 |
| 6,126,381 | A | | 10/2000 | Bacchi et al. | |
| 6,249,342 | B1 | | 6/2001 | Cheng | |
| 6,414,478 | B1 | | 7/2002 | Suzuki | |
| 6,450,755 | B1 | | 9/2002 | Cameron et al. | |
| 6,822,464 | B2 | * | 11/2004 | Suzuki | 324/754 |
| 6,838,892 | B2 | * | 1/2005 | Suzuki | 324/754 |
| 2002/0057955 | A1 | | 5/2002 | Tsubota et al. | |
| 2002/0154971 | A1 | | 10/2002 | Nguyen et al. | |
| 2003/0178987 | A1 | | 9/2003 | Suzuki | |

FOREIGN PATENT DOCUMENTS

| EP | 0 552 036 | 7/1993 |
|---|---|---|
| JP | 6-236909 | 8/1994 |
| JP | 2003-51519 | 2/2003 |

* cited by examiner

*Primary Examiner*—Ernest Karlsen
(74) *Attorney, Agent, or Firm*—Oblon, Spivak, McClelland, Maier & Neustadt, P.C.

(57) ABSTRACT

A probe card transporting apparatus includes a truck and transporting mechanism. The truck can move on a floor surface freely. The transporting mechanism is arranged above the truck to be able to separate from and come into contact with it. The transporting mechanism transports a probe card between the truck and a prober. The transporting mechanism has a base and arm mechanism. The arm mechanism moves forward/backward on the base. An aligning mechanism and fixing mechanism are provided on the base. The aligning mechanism serves for alignment with the prober. The fixing mechanism serves for fixing to the prober.

8 Claims, 13 Drawing Sheets

TRANSPORTING MECHANISM, MOVABLE PROBE CARD TRANSPORTING APPARATUS USING TRANSPORTING MECHANISM, AND PROBER

CROSS-REFERENCE TO RELATED APPLICATIONS

This application is based upon and claims the benefit of priority from the prior Japanese Patent Application No. 2002-379041, filed Dec. 27, 2002, the entire contents of which are incorporated herein by reference.

BACKGROUND OF THE INVENTION

1. Field of the Invention

The present invention relates to a transporting mechanism, a movable probe card transporting apparatus using a transporting mechanism, and a prober.

2. Description of the Related Art

Patent Reference 1 (Jpn. Pat. Appln. KOKAI Publication No. 6-236909 (claim 1)) discloses an invention for changing probe cards automatically. A stocker which stores a plurality of probe cards and an apparatus which transports the probe cards are arranged in a prober. The transporting apparatus transports the probe cards from the stocker into a prober chamber.

According to the invention disclosed by Patent Reference 1, the stocker and the probe card transporting apparatus are arranged in the prober. This increases the footprint, leading to high cost. When one probe card is shared by some probers as well, the probe card must be transferred to this other prober.

In order to solve the above problems, the present applicant proposed a probe card transporting apparatus in Jpn. Pat. Appln. KOKAI Publication No. 2003-051519. This probe card transporting apparatus has a probe card transporting mechanism and connection mechanism. The probe card transporting mechanism can move forward/backward. The connection mechanism connects the probe card transporting mechanism and a prober. The probe card transporting mechanism transports a probe card into the prober. The probe card transporting mechanism further has a carrying mechanism and elevating mechanism. When a probe card is to be transported into the prober, the carrying mechanism carries it to a card clamp mechanism in the prober. After that, the elevating mechanism lifts the probe card upward and attaches it to and detaches it from the card clamp mechanism.

When, however, the probe card transporting apparatus attaches the probe card to and detaches it from the card clamp mechanism, the probe card must be kept parallel to the card clamp mechanism. If the floor surface on which the probe card transporting apparatus is manipulated is slightly tilted, the probe card transporting mechanism and probe card are also tilted. As a result, the probe card may not be able to be transferred to the card clamp mechanism smoothly.

BRIEF SUMMARY OF THE INVENTION

The present invention has been made to solve at least one of the above problems. It is an object of the present invention to propose a transporting mechanism which can achieve at least one of decreasing the footprint of a prober, maintaining the parallel state of a large probe card and head plate in the prober, transporting the probe card to the head plate smoothly, and attaching and detaching the probe card smoothly; a movable probe card transporting apparatus using a transporting mechanism; and a prober.

Additional objects and advantages of the invention will be set forth in the description which follows, and in part will be obvious from the description, or may be learned by practice of the invention. The objects and advantages of the invention may be realized and obtained by means of instrumentalities and combinations particularly pointed out hereinafter.

According to a first aspect of the present invention, there is provided a transporting mechanism comprising a base, a first arm mechanism arranged on the base to be movable forward/backward, a second arm mechanism arranged on the first arm mechanism to be movable forward/backward, a pair of rotary bodies arranged at front and rear portions, respectively, of the first arm mechanism, an endless belt extending between the pair of rotary bodies, and a first connection tool which connects the endless belt to the base, and a second connection tool which connects the endless belt to the second arm mechanism (wherein when the endless belt is moved around the rotary bodies, the first and second arm mechanisms move forward/backward on the base).

This transporting mechanism preferably comprises at least one or a combination of a plurality of the following a to c.

a. A second arm mechanism which has a holding mechanism to hold a work-to-be-transported.

b. A first connection tool which connects the endless belt to the base on a prober side, and the second connection tool which connects the endless belt to a side of the second arm mechanism which is opposite to the prober.

c. A transporting mechanism which has a mechanism that prevents the first arm mechanism, which has moved forward from the base, from tilting.

According to a second aspect of the present invention, there is provided a transporting apparatus for transporting a probe card to/from a prober, comprising a movable truck, a transporting mechanism arranged above the truck to be able to separate from and come into contact with the truck (the transporting mechanism including a base and an arm mechanism which is arranged on the base to be movable forward/backward), a first aligning mechanism to arrange the probe card transported by the transporting mechanism at a predetermined position in the prober (the first aligning mechanism being arranged on at least one of the base and prober), and a second aligning/fixing mechanism to align and fix the base with and to the prober.

This transporting apparatus preferably comprises at least one or a combination of a plurality of the following d to j.

d. A connection manipulating mechanism which connects the truck to the prober.

e. A first aligning/fixing mechanism which aligns and fixes the transporting mechanism with and at a reference position on the truck.

f. The first aligning/fixing mechanism having an elastic member which pulls the transporting mechanism toward the truck.

g. The transporting mechanism being placed on a lower plate, the lower plate having a first slide mechanism on a lower surface thereof, and the truck having an upper plate on an upper surface thereof, the upper plate having a second slide mechanism on an upper surface thereof (the first slide mechanism being slidable on the second slide mechanism).

h. The first and second slide mechanisms being plate-like members, and at least one surface of the plate-like member of each of the first and second slide mechanisms being formed of a low-friction material.

i. The arm mechanism having a first arm mechanism which can move forward/backward on the base, and a second arm mechanism which can move forward/backward on the first arm mechanism.

j. A mechanism that prevents the transporting mechanism, which has moved forward from the truck, from tilting.

According to a third aspect of the present invention, there is provided a prober comprising a prober chamber (having a probe card and an opening which is formed in at least one side surface of a side surface and upper surface of the prober chamber), a probe card transporting mechanism (which loads the probe card in and unloads it from the probe chamber through the opening of the prober chamber), an elevating body arranged on an outer side surface of the prober chair to be movable vertically, a second aligning/fixing mechanism provided to the elevating body and transporting mechanism (the second aligning/fixing mechanism serving to align and fix the transporting mechanism at a predetermined position in the prober chamber), and an elevating body driving mechanism which vertically moves the elevating body.

This prober preferably further comprises any one or a plurality of the following k to l.

k. A support mechanism which supports the transporting mechanism above a truck to be able to separate from and come into contact with the truck, and a connecting mechanism which connects the truck to the prober chamber.

l. The prober chamber having a third aligning/fixing mechanism which aligns in a horizontal direction and fixes the probe card loaded by the transporting mechanism.

According to a fourth aspect of the present invention, there is provided, a method of loading a probe card into a prober in the prober having a probe card transporting apparatus, comprising (a) placing the probe card on the probe card transporting apparatus, (b) connecting the probe card transporting apparatus to the prober, (c) adjusting the height of the probe card to be transported by the probe card transporting apparatus to a height corresponding to the prober, and (d) loading the probe card into the prober with the probe card transporting apparatus.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are schematic views showing the main part of a transporting mechanism in the probe card transporting apparatus shown in FIG. 1, in which FIG. 2A is a side view of the same, and FIG. 2B is a plan view of the same seen from below;

DETAILED DESCRIPTION OF THE INVENTION

Mode of Embodiment of the Invention

The present invention will be described by way of the embodiments shown in FIGS. 1 to 14.

Figure 1:
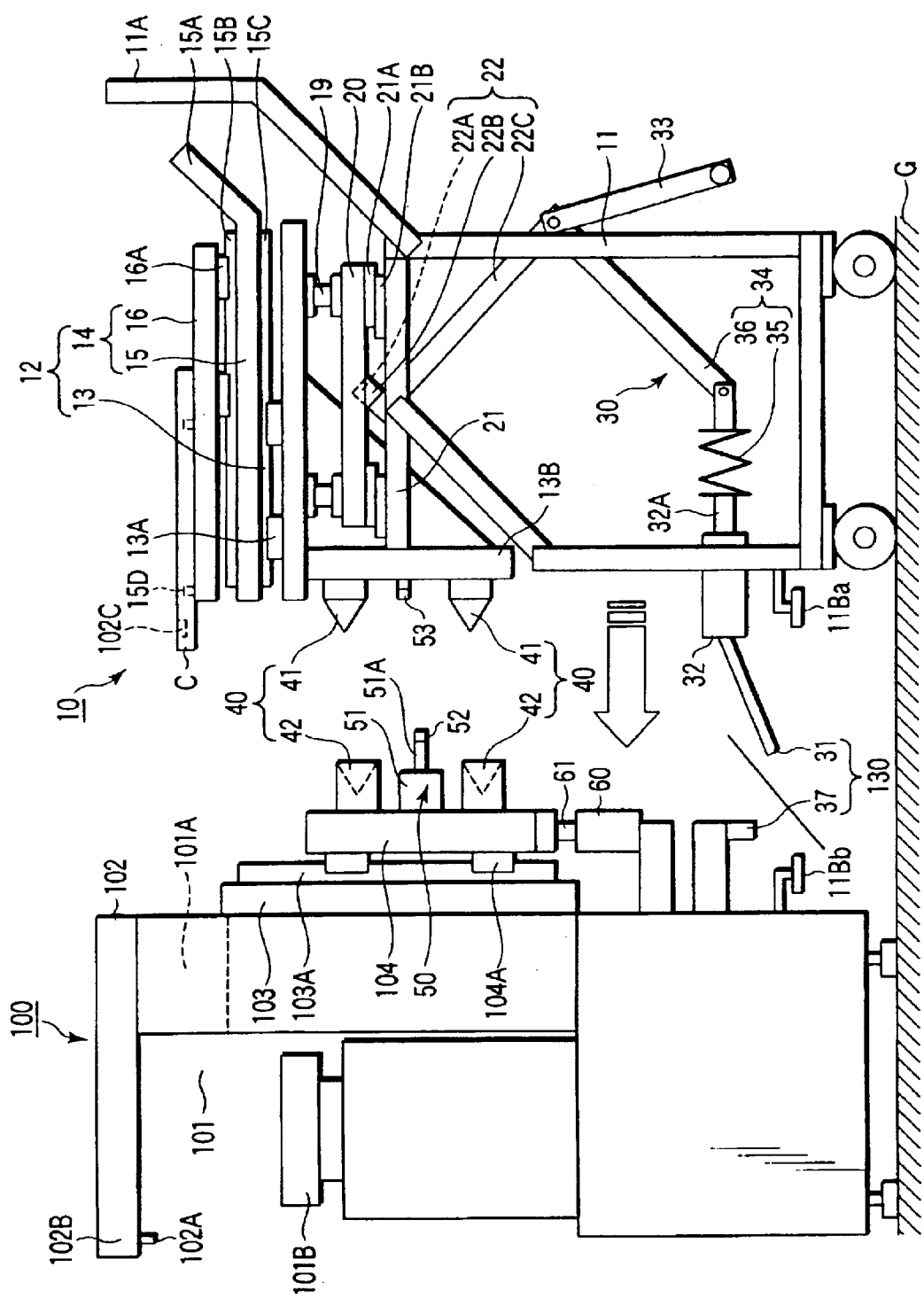
FIG. 1 is a side view schematically showing a probe card transporting apparatus and a prober according to one embodiment of the present invention.

A probe card transporting apparatus 10 according to this embodiment has a truck 11 and transporting mechanism 12, as shown in, e.g., FIG. 1. The truck 11 can move on a floor surface G freely. The transporting mechanism 12 is arranged above the truck 11 to be able to separate from and come into contact with it. The transporting mechanism 12 transports a probe card C between the truck 11 and a prober 100. The prober 100 has a prober chamber 101, a head plate 102, and the probe card C. The prober chamber 101 tests the electrical characteristics of an object to be tested (e.g., a semiconductor wafer (to be referred to as a "wafer" hereinafter)) by using the probe card C. The head plate 102 forms the upper surface of the prober chamber 101. The probe card C is fixed to the head plate 102. The transporting mechanism 12 unloads the probe card C from and loads it in the prober chamber 101 through an opening 101A formed in the prober chamber 101.

The head plate 102 has a probe card holder 102B, and the probe card C has a plurality of positioning holes 102C. The probe card holder 102B has a plurality of guide pins 102A. The guide pins 102A serve to reliably mount the probe card C transported by the transporting mechanism 12 on the probe card holder 102B.

A stage 101B which can move in the horizontal and vertical directions is arranged in the prober chamber 101. A wafer is placed on the stage. While the electrodes of the wafer and probes C' (shown in FIG. 11) formed on the lower surface of the probe card C are in contact with each other, the electrical characteristics of the wafer are tested.

When the transporting mechanism 12 is to unload the probe card C from and load it in the prober chamber 101, a first connecting mechanism 130 connects the probe card transporting apparatus 10 to the prober 100. As shown in FIG. 1, the first connecting mechanism 130 has at least one connection tool 31 (e.g., a square ring-like structure), a driving portion 32, and a second connecting mechanism 34. The driving portion 32 swings the connection tool 31 vertically. The second connecting mechanism 34 connects the driving portion 32 and a manipulation handle 33. The connection tool 31 incorporates a link mechanism and cylinder mechanism. As shown in FIG. 1, the second connecting mechanism 34 has a coil spring 35 and link 36. The coil spring 35 is connected to a rod 32A of the cylinder mechanism of the driving portion 32. The link 36 is connected to the coil spring 35. The manipulation handle 33 is locked when it is pulled upward from the state shown in FIG. 1. Although not shown, the driving portion 32 has a coil spring which biases the connection tool 31 downward. As shown in FIG. 1, when the prober 100 and probe card transporting apparatus 10 that have been connected to each other are disconnected, the connection tool 31 is restored from the horizontal state to the tilted state by the spring force of the coil spring 35. The prober 100 has a connection pin 37 (constituting part of the first connecting mechanism 130) corresponding to the connection tool 31.

A power receiving portion 11Ba is arranged on the front surface of the truck 11. A power supply portion 11Bb is arranged on the front surface of the prober 100. When the truck 11 and prober 100 are connected, the power receiving portion 11Ba is electrically connected to the power supply portion 11Bb. Hence, when the switch of the probe card transporting apparatus 10 is operated, an elevating body driving mechanism (to described later) and the like provided on the prober 100 can be driven.

When the manipulation handle 33 is pulled upward from the state shown in FIG. 1, the second connecting mechanism 34 and driving portion 32 move the connection tool 31 upward. The connection tool 31 that has moved upward fits in the connection pin 37 of the prober 100. The elastic coil spring 35 draws the connection tool 31, to connect the connection tool 31 and connection pin 37 reliably. On the left and right (a direction perpendicular to the surface of the sheet of the drawing) of the first connecting mechanism 130, projecting members (not shown) are provided to the truck 11 and prober 100, respectively. The projecting members act against the drawing force of the connection tool 31.

Figure 2A:
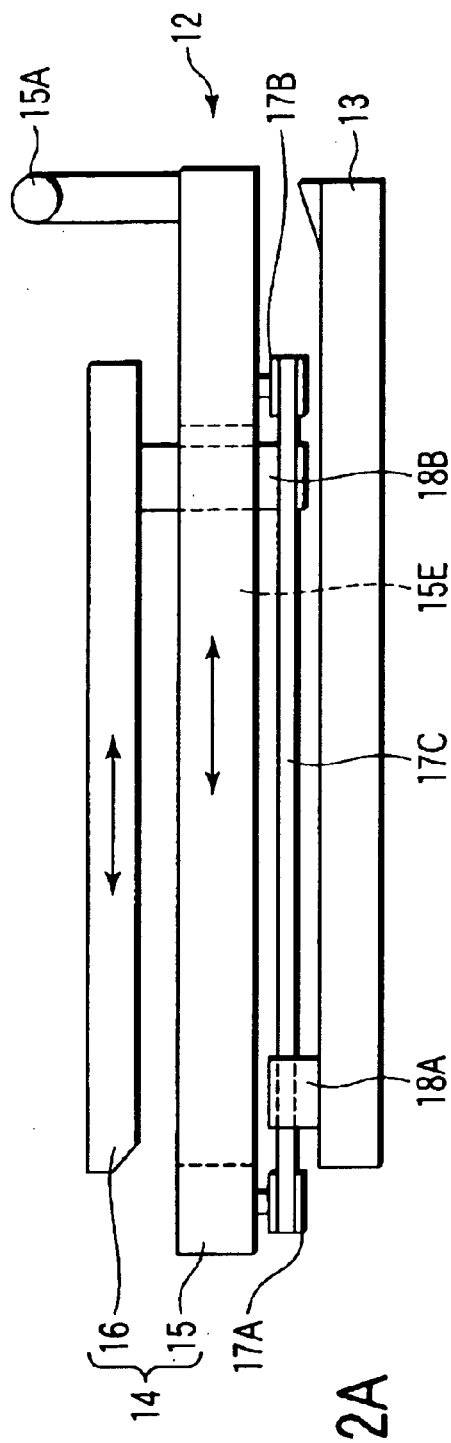
Figure 2B:
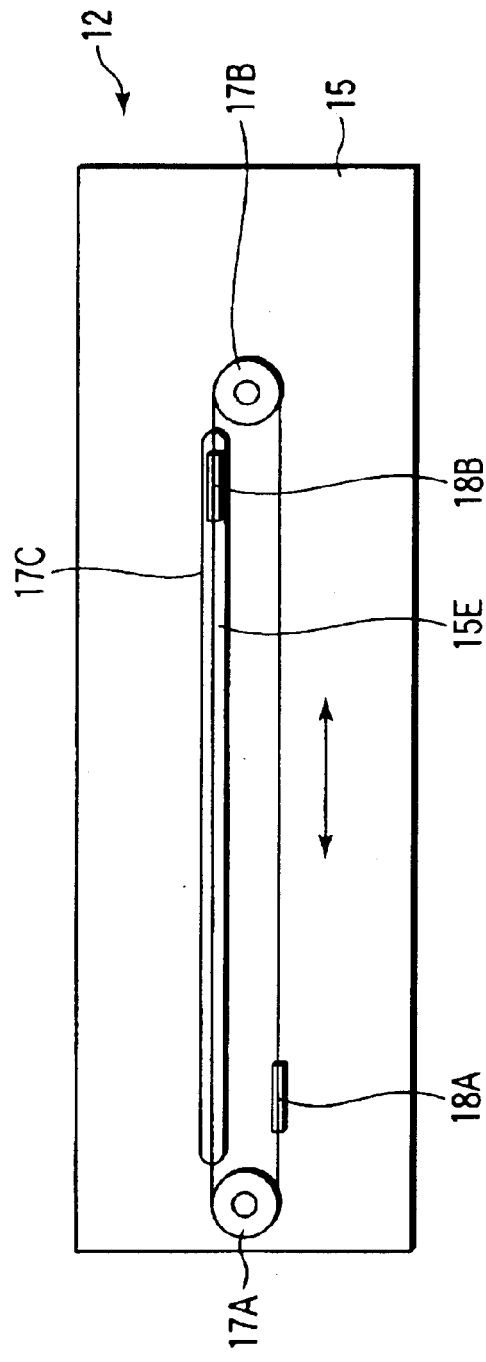

As shown in FIG. 1 and FIGS. 2A and 2B, the transporting mechanism 12 can have an arm mechanism 14 which moves forward/backward on a base 13. The base 13 can be arranged above the truck 11 to be able to separate from and come into contact with it. The arm mechanism 14 can have first and second arms 15 and 16. The first arm 15 moves forward/backward on the base 13 in the back-and-forth direction. The second arm 16 moves forward/backward on the first arm 15 in the back-and-forth direction. The probe card C is placed on the second arm 16. When a handle 15A attached to the rear end of the first arm 15 is manipulated, the arm mechanism 14 can be moved forward/backward. As shown in FIG. 1, the first arm 15 moves forward/backward on the base 13. The second arm 16 moves forward/backward on the first arm 15. A mechanism that smoothes these forward/backward movement is preferably provided. For example, a pair of left and right guide rails 15B and a pair of left and right guide rails 15C can be attached to the upper and lower surfaces, respectively, of the first arm 15. Alternatively, in place of the guide rails, a low-friction plate, a bearing mechanism, an air bearing mechanism, a magnetic floating mechanism, or the like can be employed.

The guide rails 15B and 15C engage with guide members 16A and 13A (see FIG. 1) attached to the lower surface of the second arm 16 and to the base 13, respectively. A plurality of mechanisms (e.g., guide pins) 15D for holding the probe card C are preferably arranged on the upper surface of the second arm 16. The guide pins 15D always hold the probe card C in a given direction.

As shown in FIGS. 2A and 2B, a pair of front and rear rotary bodies (e.g., pulleys) 17A and 17B are preferably rotatably attached to the lower surface of the first arm 15. The pair of rotary bodies 17A and 17B can be arranged inside the pair of guide rails 15C (FIG. 1). An endless belt 17C can be wound around the pulleys 17A and 17B. The endless belt 17C is connected to the base 13 and second arm 16 through first and second connection tools 18A and 18B, respectively. The first connection tool 18A can be fixed to the front end portion of the base 13, and the second connection tool 18B can be fixed to the rear end portion of the second arm 16. The second connection tool 18B extends through an elongated hole 15E of the first arm 15. The elongated hole 15E is formed in the first arm 15 in the back-and-forth direction. The second connection tool 18B connects the second arm 16 and endless belt 17C. The length of the elongated hole 15E of the first arm 15 can be set to correspond to the moving distance of the second arm 16.

Upon manipulation of the handle 15A, when the first arm 15 moves forward/backward, the endless belt 17C connected to the first connection tool 18A also moves for the same distance. The second arm 16 moves forward/backward on the first arm 15 in the same direction for the same distance. Consequently, the second arm 16 connected to the second connection tool 18B moves forward/backward on the base 13 at a speed twice that of the first arm 15 for a distance twice that of the first arm 15. Alternatively, the pair of front and rear pulleys 17A and 17B and the endless belt 17C may be arranged on the upper surface of the first arm 15.

As shown in FIG. 1, a lower plate 20 can be arranged on the lower surface of the base 13 through an elastic member 19 such as rubber. The lower plate 20 can have a first slide mechanism (e.g., a contact plate, bearing mechanism, air bearing mechanism, magnetic floating mechanism, or the like; to be referred to as a "first contact plate" hereinafter) 21A on its lower surface. The elastic member 19 can serve as a buffer member that absorbs impact generated when the transporting mechanism 12 lands on the truck 11, and impact received from the floor surface G when the truck 11 moves. The first contact plate 21A opposes a second slide mechanism (e.g., a contact plate, bearing mechanism, air bearing mechanism, magnetic floating mechanism, or the like; to be referred to as a "second contact plate" hereinafter) 21B attached to the upper surface of the truck 11. Each of the contact plates 21A and 21B can be formed of a low-friction material (e.g., ethylene tetrafluoride resin) having a low coefficient of friction. The transporting mechanism 12 can separate from and come into contact with the truck 11 at the boundary of the first and second contact plates 21A and 21B. For example, the transporting mechanism 12 is fixed at a predetermined position on the truck 11 by a position fixing mechanism 22 shown in FIG. 1. The position fixing mechanism 22 prevents the transporting mechanism 12 from falling from the truck 11 during transportation.

The position fixing mechanism 22 can have first and second aligning/fixing mechanisms 22A and 22B, and a connecting mechanism 22C, as shown in FIG. 1. The first aligning/fixing mechanism 22A is arranged at substantially the center of the lower plate 20, and fits on the second aligning/fixing mechanism 22B. The connecting mechanism 22C connects the second aligning/fixing mechanism 22B and manipulation handle 33. When the probe card transporting apparatus 10 is connected to the prober 100, the manipulation handle 33 is pulled upward counterclockwise from the position shown in FIG. 1. By this manipulation, the second aligning/fixing mechanism 22B disengages from the first aligning/fixing mechanism 22A through the connecting mechanism 22C, so that the transporting mechanism 12 is released from the truck 11. In this state, the transporting mechanism 12 can slide on the truck 11 in the horizontal direction through the first and second contact plates 21A and 21B. When fixing the transporting mechanism 12 on the truck 11, the manipulation handle 33 is rotated clockwise from the pulled-up position, and is restored to the initial position. The aligning/fixing mechanism 22B fits in the aligning/fixing mechanism 22A, so that the transporting mechanism 12 is fixed on the truck 11.

Figure 3:
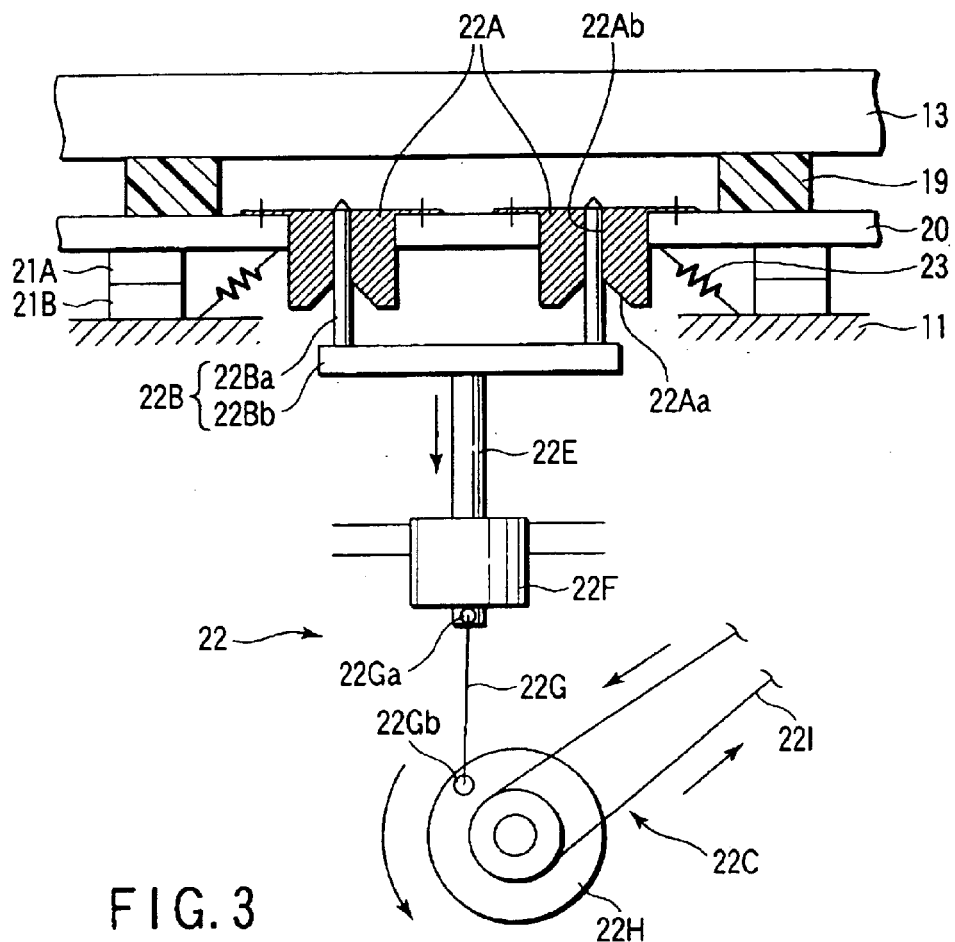
FIG. 3 is a partially sectional view schematically showing a position fixing mechanism in the probe card transporting apparatus shown in FIG. 1.

FIG. 3 shows the practical structure of the position fixing mechanism 22. As shown in FIG. 3, the position fixing mechanism 22 can have the first and second aligning/fixing mechanisms 22A and 22B, the connecting mechanism 22C, and a plurality of elastic members (e.g., four coil springs) 23. The plurality of coil springs are connected between the truck 11 and lower plate 20. The coil springs 23 always bias the base 13 of the transporting mechanism toward the reference position on the truck 11. The four coil springs 23 can be arranged radially in directions of substantially 90° from each other about the reference position as the center. The reference position is where the position of the first aligning/fixing mechanism 22A of the transporting mechanism 12 on the truck 11 substantially coincides with the position of the second aligning/fixing mechanism 22B of the truck 11. As shown in FIG. 3, the first aligning/fixing mechanism 22A can have recesses 22Aa and through holes 22Ab. The recesses 22Aa are conically formed in the lower surface of the first aligning/fixing mechanism 22A. The through holes 22Ab extend from the conical recesses 22Aa toward the upper surface of the first aligning/fixing mechanism 22A. The first aligning/fixing mechanism 22A can be arranged to cover the front and rear portions of the lower plate 20. The second aligning/fixing mechanism 22B can have a pair of front and rear pins 22Ba and a support member 22Bb. The pins 22Ba extend through the front and rear through holes 22Ab of the first aligning/fixing mechanism 22A. The support member 22Bb supports the pins 22Ba. The connecting mechanism 22C can have a rod 22E, cylinder 22F, link 22G, pulley 22H, and timing belt 22I. The rod 22E depends downward from the support member 22Bb of the second aligning/fixing mechanism 22B. The cylinder 22F guides the rod 22E in the vertical direction. The link 22G is connected to the rod 22E, projecting downward through the cylinder 22F, through a pin 22Ga. The pulley 22H is connected to the link 22G through a pin 22Gb. The timing belt 22I extends between the pulley 22H and the pulley (not shown) of the manipulation handle 33.

When the manipulation handle 33 is rotated counterclockwise, the pulley 22H rotates counter-clockwise through the timing belt 22I as indicated by an arrow (FIG. 3). Due to this rotation, the pins 22Ba of the second aligning/fixing mechanism 22B disengage from the first aligning/fixing mechanism 22A. Consequently, the transporting mechanism 12 is released from the truck 11. When the manipulation handle 33 is rotated clockwise, the pins 22Ba of the second aligning/fixing mechanism 22B fit in the first aligning/fixing mechanism 22A, so that the transporting mechanism 12 is fixed on the truck 11.

An aligning mechanism 40 (41, 42) can be provided to the probe card transporting apparatus 10 and prober 100. After a connecting mechanism 130 connects the probe card transporting apparatus 10 and prober 100, the aligning mechanism 40 aligns them. More specifically, the aligning mechanism 40 has a support plate 13B depending downward from the front end portion of the lower surface of the base 13, as shown in FIG. 1. The support plate 13B has a plurality of (e.g., three; only two are shown in FIG. 1) engaging projections 41. Three engaging recesses 42 can be arranged below the opening 101A of the prober chamber 101. The engaging recesses 42 engage with the corresponding engaging projections 41. A support body 103 can be attached to the front surface of the prober chamber 101. A pair of left and right guide rails 103A can be attached to the support body 103. An elevating body 104 is attached to the guide rails 103A through engaging members 104A. The elevating body 104 moves upward/downward along the guide rails 103A. The plurality of (e.g., three) engaging recesses 42 are arranged on the elevating body 104. The engaging recesses 42 can have a shape such as an inverted triangle, an inverted cone, or the like. The engaging portions of the engaging projections 41 can be formed as, e.g., conical projections. The engaging portions of the engaging recesses 42 can be formed as conical recesses. Assume that the engaging projections 41 and engaging recesses 42 have conical shapes. Even if the floor surface G is somewhat tilted, the probe card transporting apparatus 10 and prober 100 can be reliably engaged with each other by only roughly aligning the probe card transporting apparatus 10 with the prober 100.

A fixing mechanism 50 can be further provided to the prober 100, as shown in FIG. 1. After alignment with the prober 100 is performed, the fixing mechanism 50 fixes the probe card transporting apparatus 10 and prober 100 while aligning them reliably. For example, the fixing mechanism 50 can have a pair of left and right driving mechanisms (e.g., air cylinders) 51, plate-like engaging elements 52, and L-shaped to-be-engaged elements 53, as shown in FIG. 1. The air cylinders 51 are arranged on the elevating body 104 between the upper and lower engaging recesses 42. The engaging elements 52 are horizontally attached to the distal ends of piston rods 51A of the air cylinders 51. The to-be-engaged elements 53 are attached to the support plate 13B such that the engaging elements 52 engage with them. The cylinder rods 51A can be rotated forward and backward by rotating mechanisms 51B.

A case wherein the probe card transporting apparatus 10 is to be fixed to the prober 100 will be described. While the piston rods 51A of the fixing mechanism 50 are extended, the probe card transporting apparatus 10 approaches the prober 100. When the to-be-engaged elements 53 reach deep into the engaging elements 52, the engaging elements 52 rotate through a rotary driving mechanism. Thus, the engaging elements 52 and to-be-engaged elements 53 engage with each other. When the air cylinders 51 retract the piston rods 51A, the transporting mechanism 12 is pulled toward the prober 100 through the engaging elements 52 and to-be-engaged elements 53, and is fixed to the prober 100.

An elevating body driving mechanism (e.g., an air cylinder) 60 can be arranged below the elevating body 104, as shown in FIG. 1. The air cylinder 60 is attached to the lower portion of the prober chamber 101 with its piston rod 61 facing up. The elevating body 104 can be moved vertically through the piston rod 61.

Referring to FIG. 1, reference numeral 11A denotes a handle attached to the rear end of the truck 11. The operator holds the handle 11A and moves the probe card transporting apparatus 10 by pushing it. Switches (not shown) for driving the elevating air cylinder 60 can be attached to the handle 11A. The air cylinder 60 can be driven by operating these switches.

Figure 4:
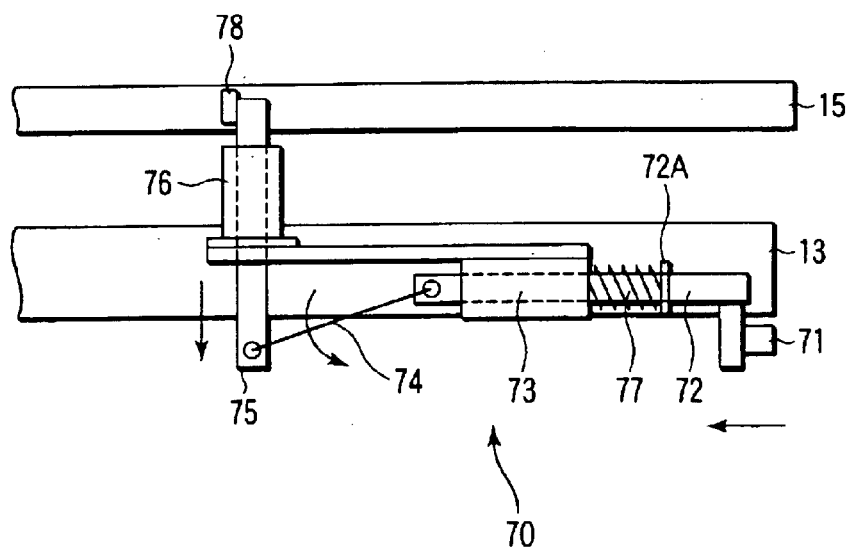
FIG. 4 is a schematic view showing a stopper mechanism for a transporting mechanism in the probe card transporting apparatus shown in FIG. 1.

As shown in FIG. 4, a stopper mechanism 70 which regulates forward movement of the arm mechanism 14 can be arranged on the base 13 of the transporting mechanism 12. As shown in FIG. 4, the stopper mechanism 70 has an abutting member 71, first rod 72, and first and second cylinders 73 and 76. The abutting member 71 abuts against the prober 100. The first rod 72 has the abutting member 71 at its distal end. The first cylinder 73 guides the rod 72 in the horizontal direction. The second cylinder 76 vertically guides a rod 75 arranged vertically. The second rod 75 is pin-connected to the proximal end portion of the first rod 72, extending through the cylinder 73, through a link 74. A flange 72A is formed on the distal end of the first rod 72. A spring coil 77 is elastically interposed between the flange 72A and first cylinder 73. The distal end portion of the second rod 75 projecting from the upper end of the second cylinder 76 engages with a locking member 78 attached to the first arm 15. The distal end of the second rod 75 regulates the first arm 15 from popping up from the base 13.

Assume that the abutting member 71 of the stopper mechanism 70 abuts against the prober 100 and that the first rod 72 is pushed backward against the biasing force of the spring coil 77. Then, the second rod 75 follows the second cylinder 76 to move downward by the link 74. The second rod 75 disengages from the locking member 78 of the first arm 15 and releases the arm mechanism 14 (15). Thus, the arm mechanism 14 (15) can move forward.

The operation will be described.

(a) The probe card C is placed on the transporting mechanism 12, as indicated by an arrow in FIG. 1.

(b) The operator holds the handle 11A of the truck 11, and pushes the probe card transporting apparatus 10 to move it to the front surface of a predetermined prober 100.

Figure 5:
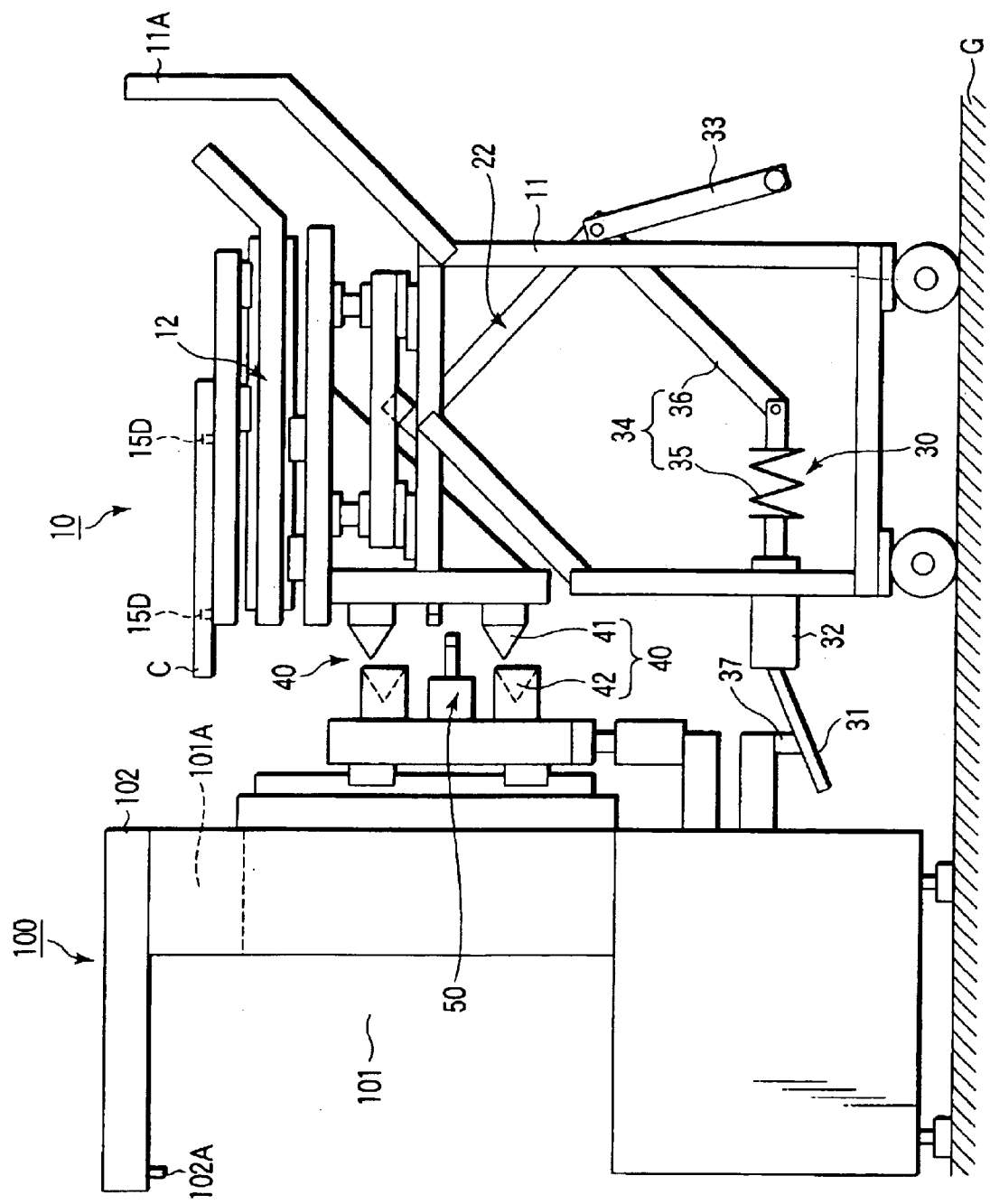
FIG. 5 is a side view schematically showing the state immediately before the probe card transporting apparatus and the prober shown in FIG. 1 are connected.

(c) As shown in FIG. 5, the connection tool 31 of the connecting mechanism 30 is positioned immediately under the connection pin 37 of the prober 100.

Figure 6:
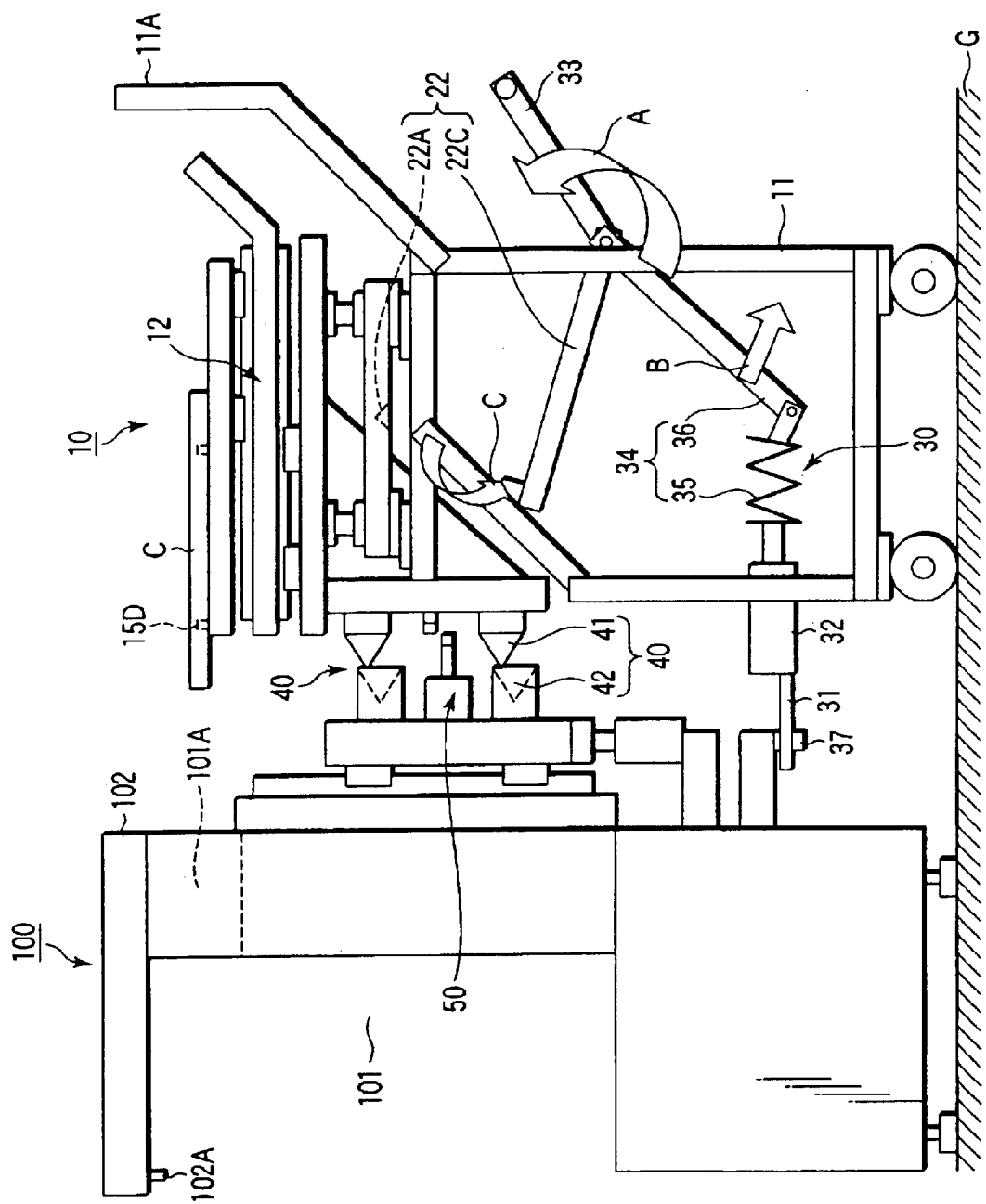
FIG. 6 is a side view schematically showing the state wherein the probe card transporting apparatus and the prober shown in FIG. 1 are connected.

(d) The operator lifts the manipulation handle 33 upward from the lower end position shown in FIG. 5 as indicated by an arrow A in FIG. 6. Thus, the link 36 rotates counterclockwise, as indicated by an arrow B, and pulls the coil spring 35. The driving portion 32 swings the connection tool 31 upward to set it in the horizontal position. The connection tool 31 catches the connection pin 37 of the prober 100. Thus, the probe card transporting apparatus 10 and prober 100 are also roughly aligned with each other. In this state, the engaging projections 41 and engaging recesses 42 of the aligning mechanism 40 are positionally displaced from each other, as shown in FIG. 6.

(e) At this time, upon handle manipulation, the connecting mechanism 22C of the position fixing mechanism 22 rotates counterclockwise, as indicated by an arrow C. The second aligning/fixing mechanism 22B (FIG. 1) disengages from the first aligning/fixing mechanism 22A, and releases the transporting mechanism 12 from the truck 11.

Figure 7:
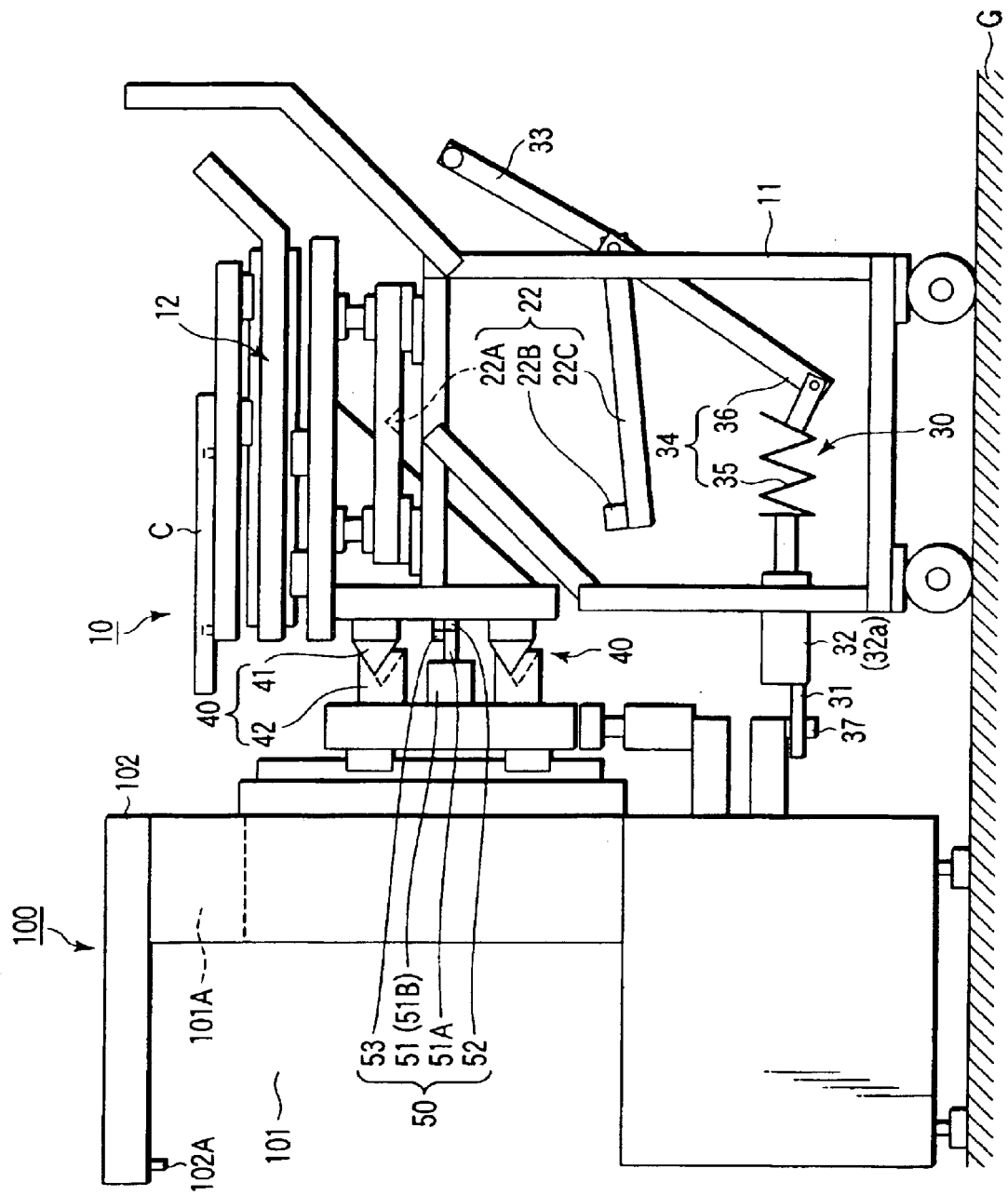
FIG. 7 is a side view schematically showing the state immediately before the probe card transporting apparatus and the prober shown in FIG. 1 are aligned.

(f) As shown in FIG. 7, the operator pulls up the manipulation handle 33 completely, so that the link 36 rotates further counterclockwise. The coil spring 35 and the link mechanism (32a) of the driving portion 32 draw the connection tool 31 into the driving portion 32. As shown in FIG. 7, the truck 11 of the probe card transporting apparatus 10 is fixed to the prober 100.

(g) The operator locks the manipulation handle 33. The engaging projections 41 of the aligning mechanism 40 fit in the engaging recesses 42 halfway, as shown in FIG. 7.

(h) As shown in FIG. 7, when the manipulation handle 33 is pulled up completely, the engaging elements 52 of the fixing mechanism 50 are located below the to-be-engaged elements 53.

Figure 8:
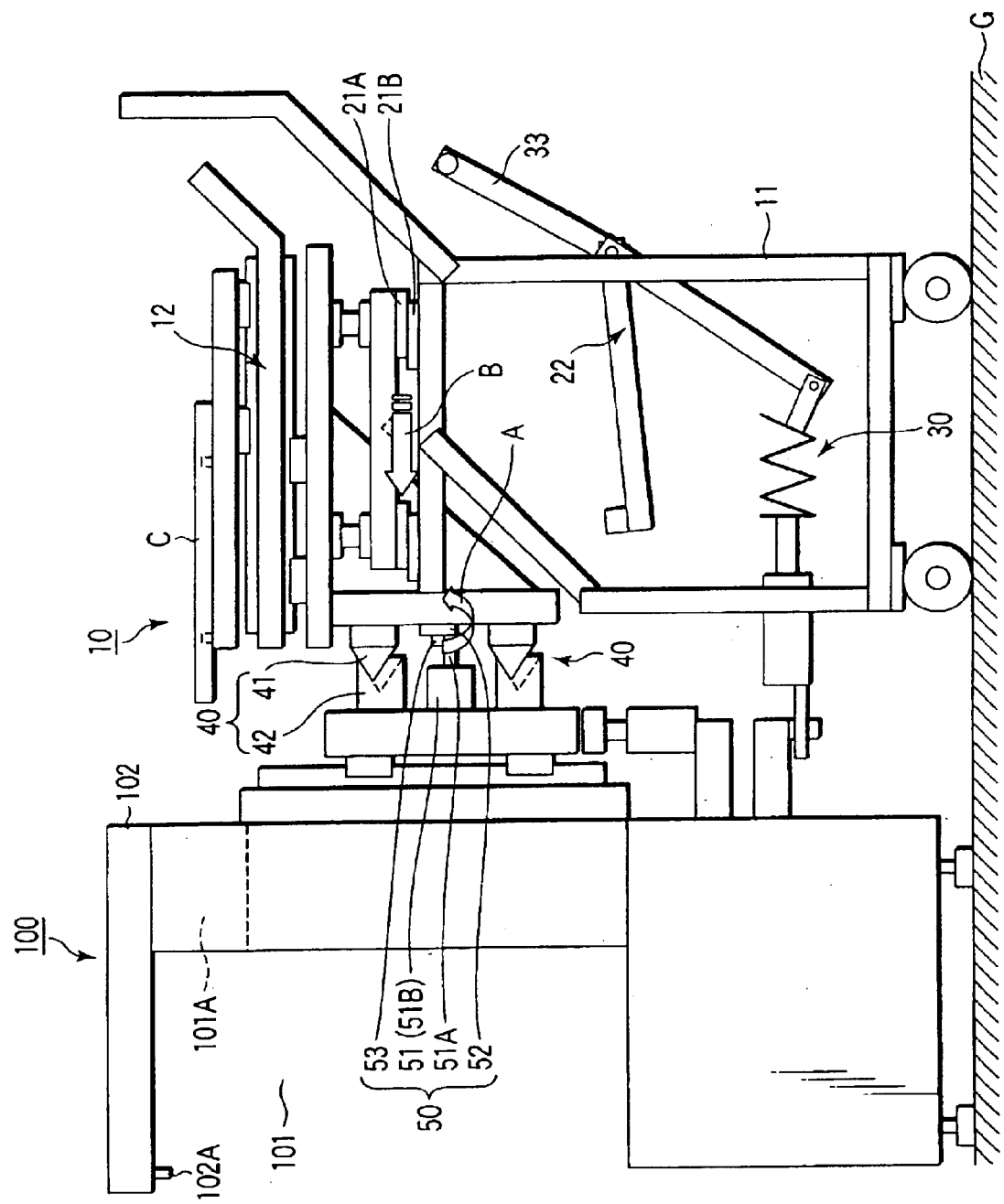
FIG. 8 is a side view schematically showing the state immediately before the transporting mechanism in the probe card transporting apparatus and the prober shown in FIG. 1 are fixed.

(i) When it is detected that the truck 11 is fixed to the prober 100, the rotary driving mechanism 51B of the fixing mechanism 50 rotates the engaging elements 52 through the piston rods 51A, as indicated by an arrow A in FIG. 8. The engaging elements 52 engage with the to-be-engaged elements 53.

(j) The air cylinders 51 retract the piston rods 51A, and draw the transporting mechanism 12 released on the truck 11 to the prober 100, as indicated by an arrow B in FIG. 8. At this time, the transporting mechanism 12 and truck 11 are in contact with each other through the first and second contact plates 21A and 21B having the small coefficients of friction. Thus, the transporting mechanism 12 can move on the truck 11 smoothly.

Figure 9:
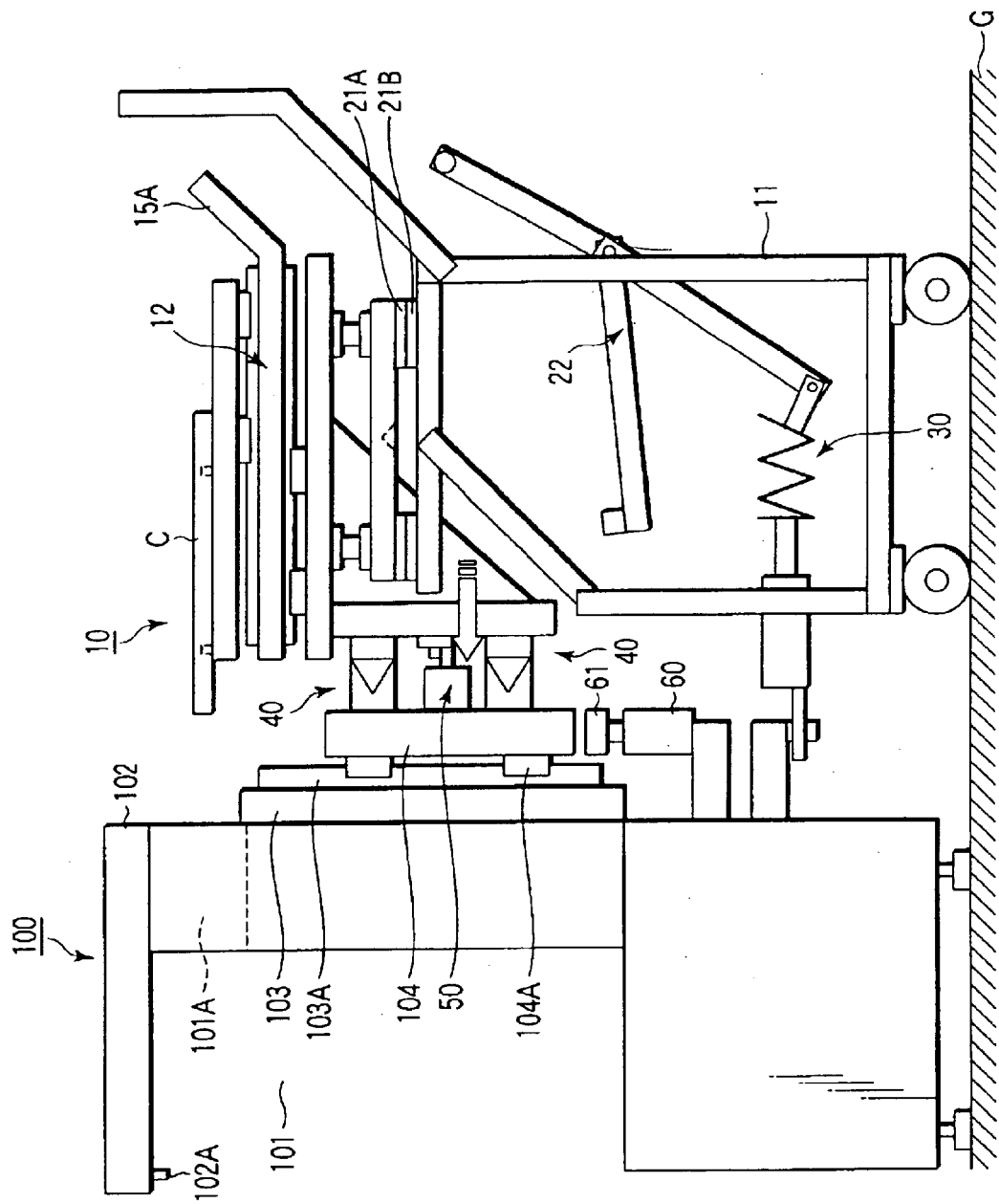
FIG. 9 is a side view schematically showing the state wherein the transporting mechanism in the probe card transporting apparatus and the prober shown in FIG. 1 are fixed.

(k) When the piston rods 51A are retracted completely, in the transporting mechanism 12, the engaging projections 41 and engaging recesses 42 of the aligning mechanism 40 which have been in the state shown in FIG. 8 engage with each other completely, as indicated by arrows in FIG. 9. By this engagement, the transporting mechanism 12 and prober 100 are aligned, and the transporting mechanism 12 is fixed to the prober 100.

(l) When the engaging projections 41 and engaging recesses 42 of the aligning mechanism 40 are to engage with each other, as shown in FIG. 9, the transporting mechanism 12 lifts the elevating body 104 upward along the guide rails 103A by a distance corresponding to the positional displacement between the engaging projections 41 and engaging recesses 42. Consequently, the elevating body 104 floats from the piston rod 61 of the air cylinder 60. In this case, the abutting member 71 of the stopper mechanism 70 shown in FIG. 4 abuts against the elevating body 104 and is pushed backward. The second rod 75 follows the second cylinder 76 to move downward, and disengages from the locking member 78. Thus, the arm mechanism 14 (15) is released from the base 13, so that it car move forward/backward.

Figure 10:
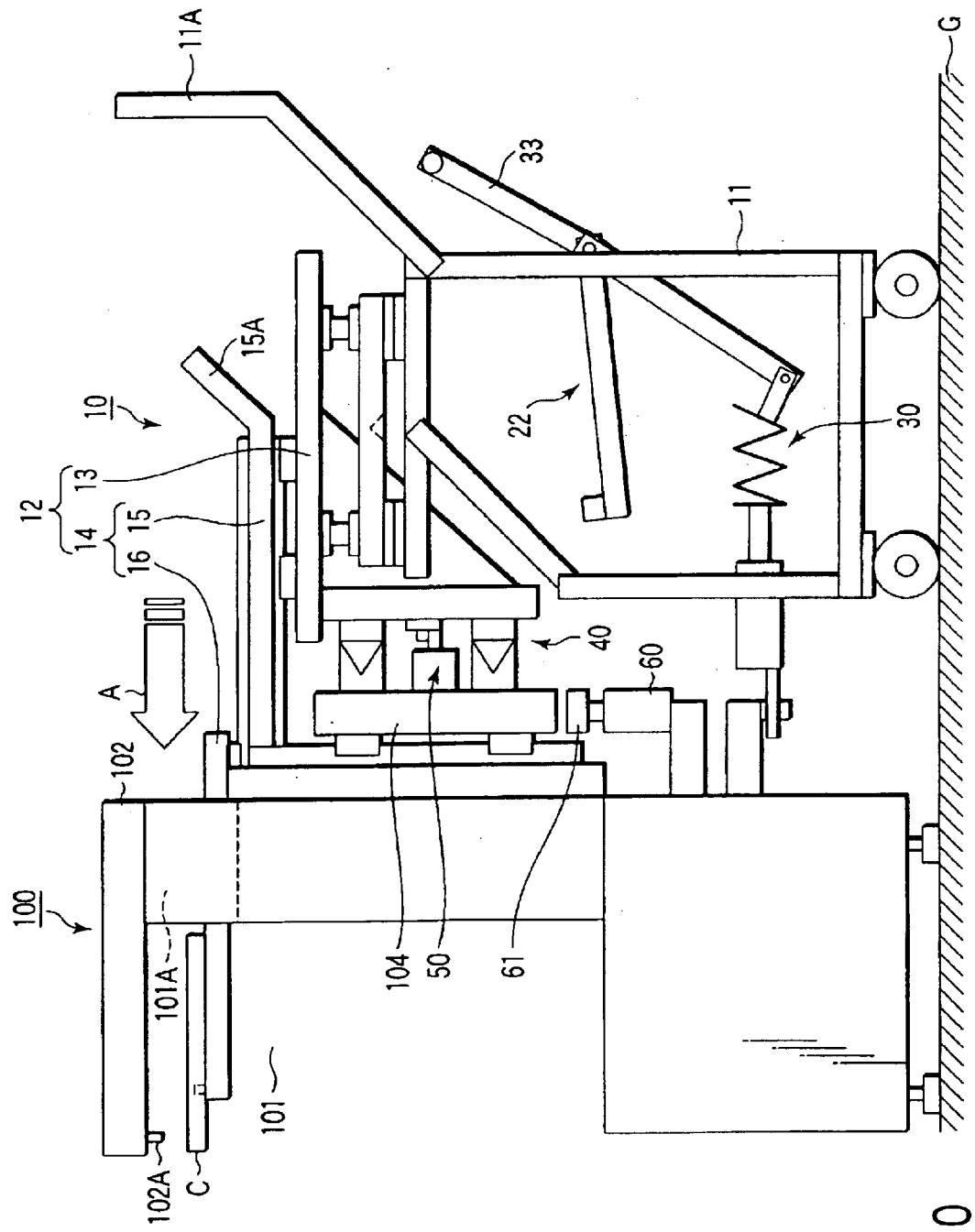
FIG. 10 is a side view schematically showing the state wherein the probe card is to be loaded in the prober through the transporting mechanism in the probe card transporting apparatus shown in FIG. 1.

(m) In the state shown in FIG. 9, the operator pushes the handle 15A. As shown in FIG. 10, the transporting mechanism 12 moves forward from the truck 11 in a direction indicated by an arrow A, to enter the prober chamber 101 through the opening 101A. At this time, when the first arm 15 of the transporting mechanism 12 moves on the base 13, the second arm 16 moves on the first arm 15 forward, parallel to the first arm 15, at the same speed for the same distance as the first arm 15. Consequently, with reference to the base 13, the second arm 16 moves forward at a speed twice that of the first arm 15 for a distance twice that of the first arm 15. In this manner, the second arm 16 enters the prober chamber 101, as shown in FIG. 10, and moves to immediately below the probe card holder 102B of the head plate 102.

Figure 11:
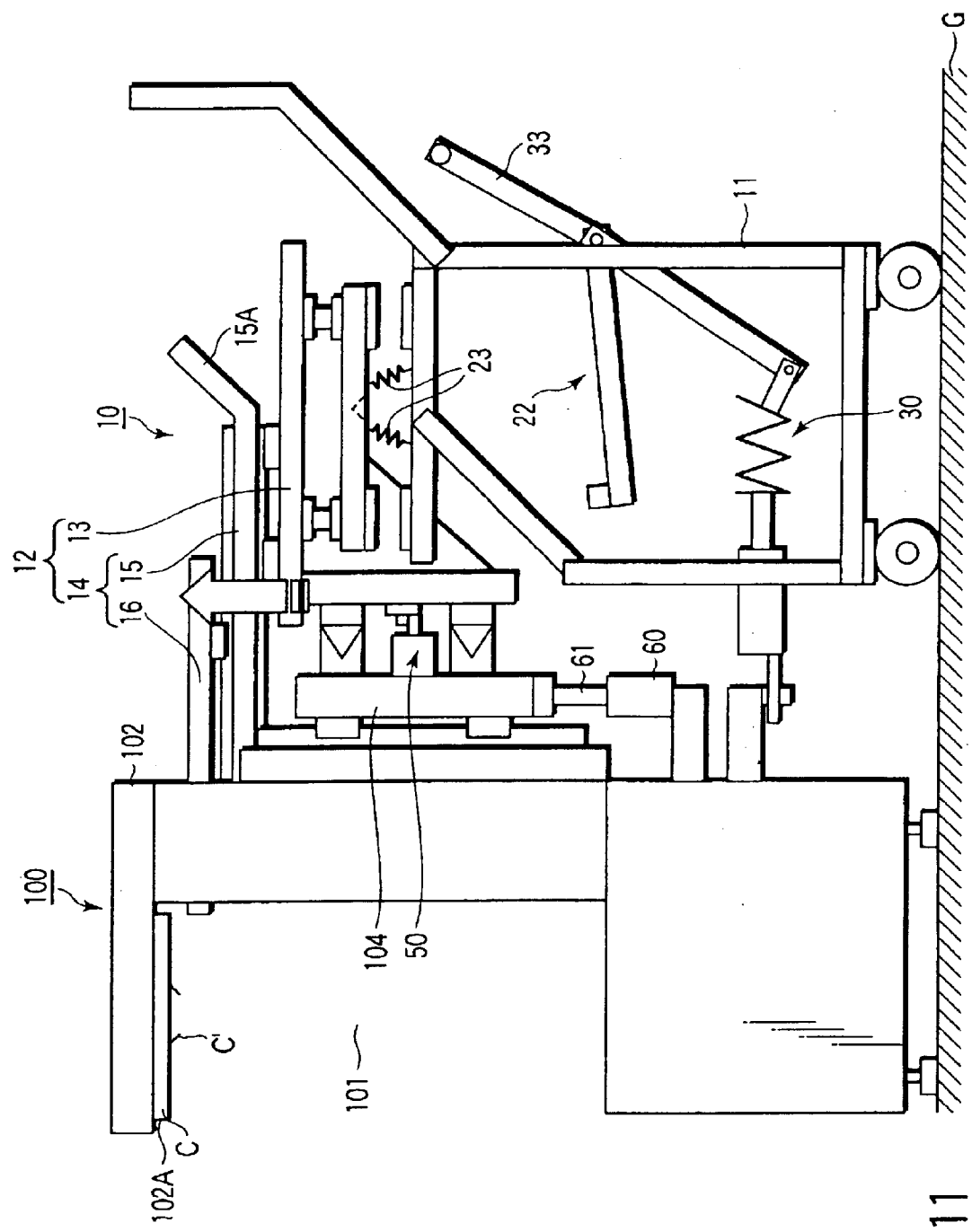
FIG. 11 is a side view schematically showing the state wherein the probe card is to be attached to the prober through the transporting mechanism in the probe card transporting apparatus shown in FIG. 1.

(n) The operator operates the switches of the handle 11A, so that the elevating air cylinder 60 extends the piston rod 61. When the piston rod 61 comes into contact with the lower end of the elevating body 104, as shown in FIG. 11, the elevating body 104 is lifted upward together with the transporting mechanism 12, as indicated by an arrow. At this time, the transporting mechanism 12 is lifted upward against the spring force of the elastic members 23.

(o) When the transporting mechanism 12 is lifted upward from the truck 11, the probe card C on the second arm 16 fits with the guide pins 102A of the probe card holder 102B of the head plate 102.

(p) In this state, the probe card holder 102B rotates. The rotating probe card holder 102B lifts upward and holds the probe card C. The probe card C is mounted on the prober 100.

(q) After that, the elevating air cylinder 60 is driven by a switch operation, and the elevating body 104 is moved downward. The transporting mechanism 12 also moves downward. The transporting mechanism 12 lands on the truck 11 through the first and second contact plates 21A and 21B having a small coefficients of friction.

(r) The operator pulls the handle 15A to pull out the first arm 15 from the prober 100. The second arm 16 restores to the initial position at a speed twice that of the first arm 15.

(s) The piston rods 51A of the air cylinders 51 of the fixing mechanism 50 extend, and the piston rods 51A rotate counterclockwise. Thus, the engaging elements 52 disengage from the to-be-engaged elements 53. The transporting mechanism 12 is separated from the prober 100. The engaged aligning mechanism 40 is also disengaged.

(t) As a result, the stopper mechanism 70 shown in FIG. 4 actuates. The first aligning/fixing mechanism 22A of the transporting mechanism 12 is aligned with the second aligning/fixing mechanism 22B of the truck 11 by the spring force of the elastic members 23.

(u) The operator pulls the manipulation handle 33 downward to the initial position. The driving portion 32 of the connecting mechanism 30 disengages the connection tool 31 from the connection pin 37 of the prober 100. The second aligning/fixing mechanism 22B of the position fixing mechanism 22 fits in the first aligning/fixing mechanism 22A. Thus, the transporting mechanism 12 is constrained on the truck 11.

(v) The probe card transporting apparatus 10 and prober 100 are disconnected from each other by the series of operations described above.

As described above, according to this embodiment, the truck 11 is movable. The transporting mechanism 12 is arranged above the truck 11 to be able to separate from and come into contact with it. The transporting mechanism 12 transports the probe card C between the truck 11 and prober 100. The transporting mechanism 12 has the base 13 and arm mechanism 14. The arm mechanism 14 moves forward/backward on the base 13. The aligning mechanism 40 for alignment with the prober 100 and fixing mechanism 50 for fixing to the prober 100 are provided to the base 13. After the transporting mechanism 12 is aligned with the prober 100 through the aligning mechanism 40, it can be reliably fixed to the prober 100 through the fixing mechanism 50. Even if the floor surface G is tilted, the transporting mechanism 12 can separate from the truck 11 and maintain the parallel state of the probe card C in the prober 100, and can smoothly attach and detach the probe card C to and from the card clamp mechanism of the head plate 102.

According to this embodiment, the connection manipulating mechanism 30 connects the truck 11 to the prober 100. After the probe card transporting apparatus 10 is moved close to the prober 100, the connection manipulating manipulation mechanism 30 is manipulated. Thus, the probe card transporting apparatus 10 can be reliably connected to the prober 100. The probe card transporting apparatus 10 and prober 100 can be aligned and fixed more reliably.

According to this embodiment, the position fixing mechanism 22 fixes the truck 11 and transporting mechanism 12 to each other. During transportation, the transporting mechanism 12 will not be positionally displaced on the truck 11 or fall from the truck 11. The coil springs 23 elastically connect the truck 11 and transporting mechanism 12. Thus, the transporting mechanism 12 can be reliably restored to the reference position on the truck 11. The first and second contact plates 21A and 21B having a small coefficients of friction are provided to the contact surfaces of the truck 11 and transporting mechanism 12. Thus, when positioning and fixing the transporting mechanism 12 and prober 100, the transporting mechanism 12 can be smoothly moved on the truck 11.

According to this embodiment, the transporting mechanism 12 has the base 13 and the first and second arms 15 and 16. The first arm 15 moves forward/backward on the base 13. The second arm 16 moves forward/backward on the first arm 15. The pair of pulleys 17A and 17B are arranged at the front and rear portions of the first arm 15. The endless belt 17C extends between the pulleys 17A and 17B. The first and second connection tools 18A and 18B connect the base 13 and second arm 16, respectively, to the endless belt 17C. The second arm 16 can be moved at a speed twice that of the first arm 15 for a distance twice that of the first arm 15 by only moving the first arm 15. Thus, the transportation time of the probe card C can be shortened, and the operation of moving the transporting mechanism 12 forward/backward is facilitated.

The prober 100 of this embodiment has the elevating body 104, aligning mechanism 40, fixing mechanism 50, and elevating air cylinder 60. The elevating body 104 is arranged on the opening 101A-side surface of the prober chamber 101 to be movable vertically. The aligning mechanism 40 is provided to the elevating body 104 and aligns the transporting mechanism 12 with the prober chamber 101. The fixing mechanism 50 is provided to the elevating body 104 and fixes the base 13 of the transporting mechanism 12 to the prober chamber 101. The air cylinder 60 moves the elevating body 104 vertically. The prober 100 can be expected to have the same operation and effect as those of the probe card transporting apparatus 10. The head plate 102 has a position fixing mechanism which fixes the probe card C, loaded by the transporting mechanism 12, in the horizontal direction. The probe card C transported by the transporting mechanism 12 can be reliably attached to and detached from the head plate 102 without failure.

Figure 12:
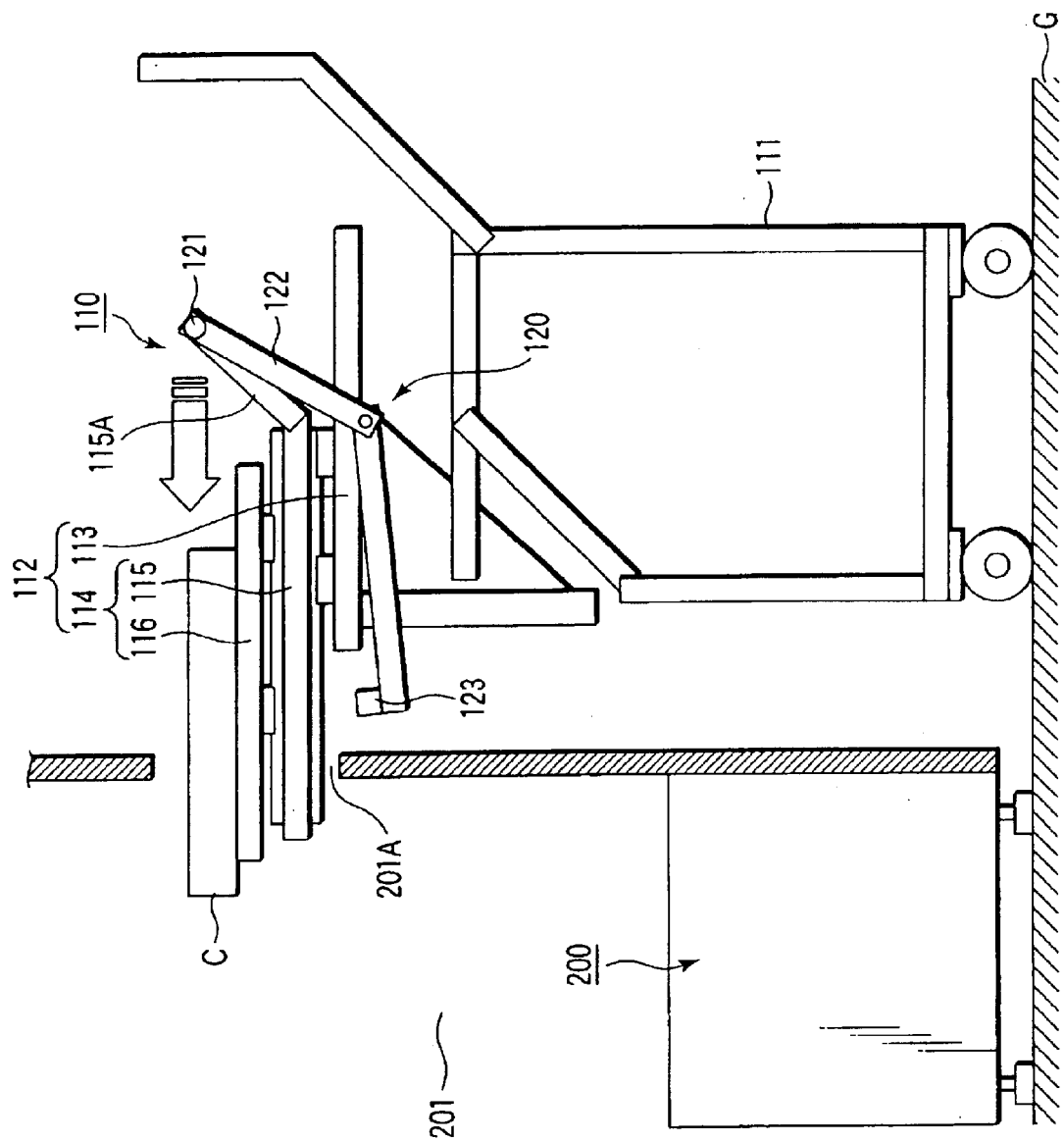
FIG. 12 is a side view schematically showing a probe card transporting apparatus and a prober according to another embodiment of the present invention, in a state immediately before a probe card is to be transported to the prober through a transporting mechanism.
Figure 13:
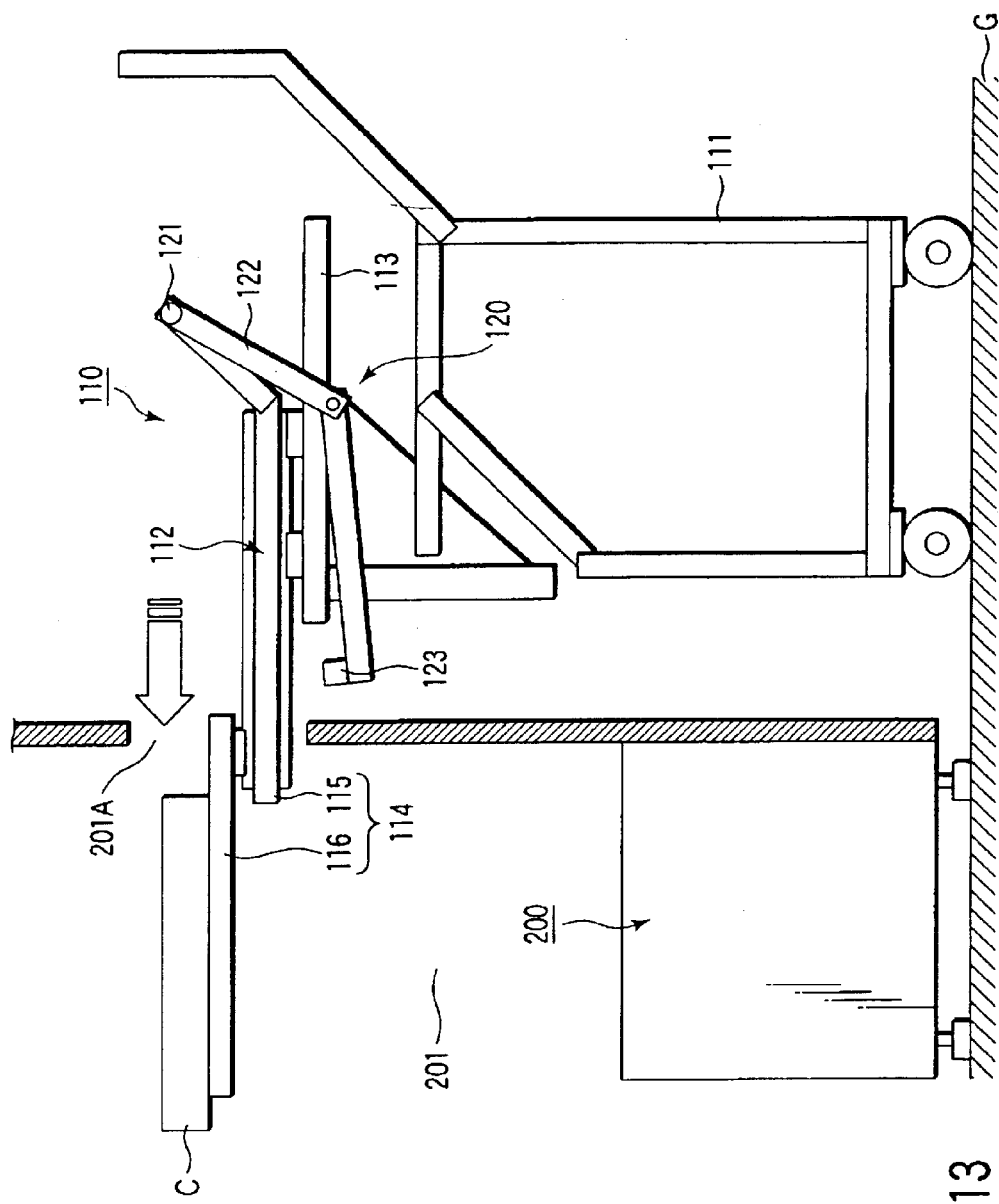
FIG. 13 is a side view schematically showing the state wherein the probe card is loaded in the prober through the transporting mechanism in the probe card transporting apparatus shown in FIG. 12.
Figure 14:
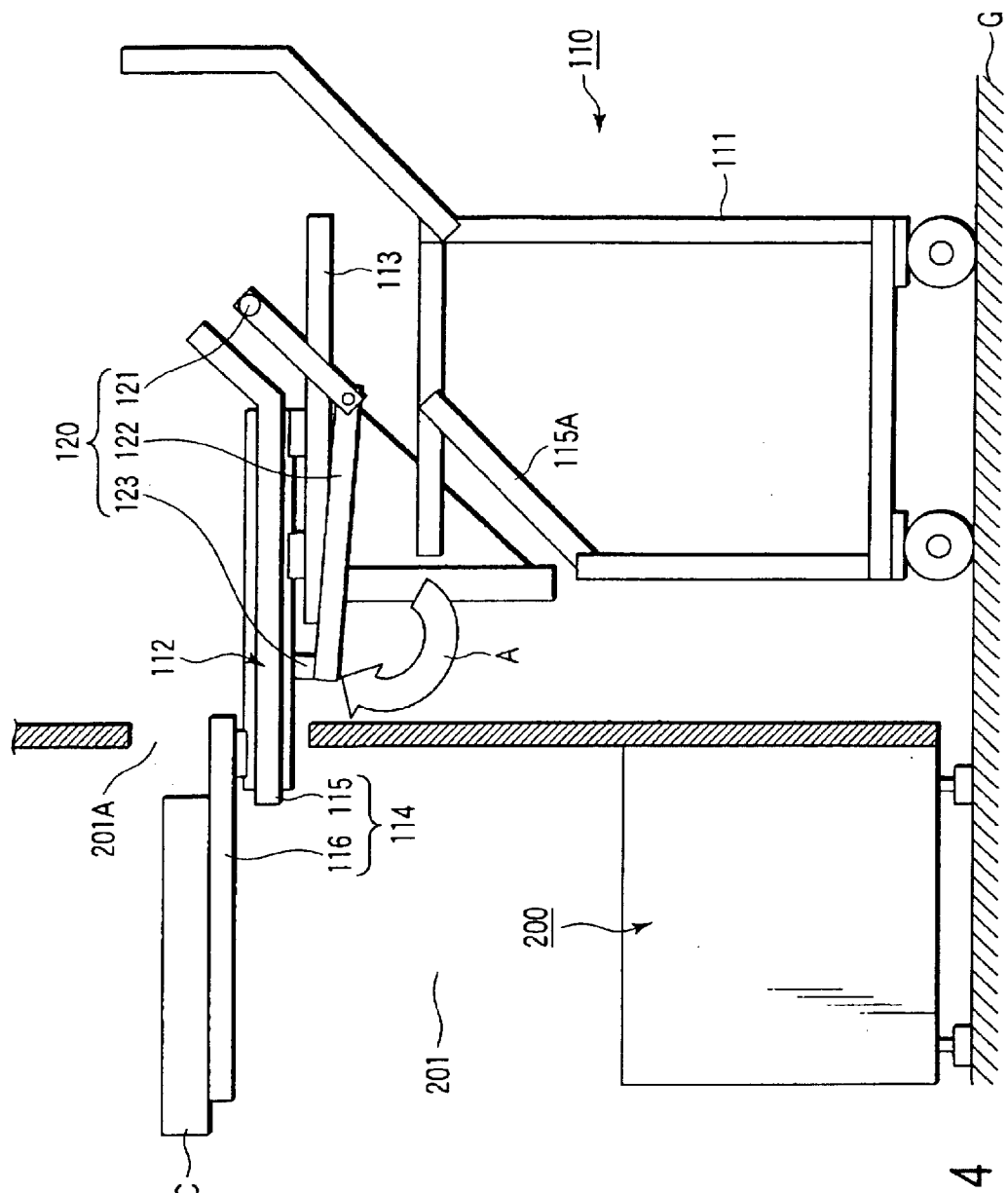
FIG. 14 is a side view schematically showing the state wherein the tilt of the transporting mechanism shown in FIG. 12 is prevented.

FIGS. 12 to 14 are conceptual views showing a probe card transporting apparatus according to another embodiment of the present invention. A probe card transporting apparatus 110 according to this embodiment has a truck 111 and transporting mechanism 112, as shown in FIG. 12. The truck 111 can move on the floor surface G freely. The transporting mechanism 112 is arranged above the truck 111 to be able to separate from and come into contact with it. The transporting mechanism 112 transports a probe card C between the truck 111 and a prober 200. The truck 111 and transporting mechanism 112 can be formed in the same manner as in the embodiment described with reference to FIGS. 1 to 11. The transporting mechanism 112 has a base 113 and first and second arms 115 and 116. The second arm 116 can move at a speed twice that of the first arm 115 for a distance twice that of the first arm 115, in the same manner as the transporting mechanism 12 shown in FIG. 2.

In the probe card transporting apparatus 110 of this embodiment, the first and second arms 115 and 116 move forward on the base 113. A tilt prevention mechanism 120 supports the first and second arms 115 and 116 from below, when they are tilted by the weight of a probe card C which is particularly heavy, thus preventing them from tilting forward. In FIG. 12, a connecting mechanism 30, aligning mechanism 40, fixing mechanism 50, elevating body driving mechanism 60, and the like which are identical to those of the embodiment described with reference to FIGS. 1 to 11 are omitted.

As shown in FIG. 12, the tilt prevention mechanism 120 has a manipulation handle 121, substantially V-shaped lever member 122, and abutting member 123. The lever member 122 is axially supported by the base 113. The abutting member 123 is attached to the distal end of the lever member 122. When the manipulation handle 121 is manipulated, the lever member 122 swings to lift the abutting member 123 upward. The abutting member 123 supports the first arm 115 from below.

The operation will be described.

(a) The probe card C is placed on the second arm 116, as shown in FIG. 12.

(b) When the operator pushes a handle 115A in the direction indicated by an arrow in FIG. 12, the first arm 115 moves forward on the base 113. During this movement, the second arm 116 moves forward on the base 113 at a speed twice that of the first arm 115 for a distance twice that of the first arm 115.

(c) As shown in FIG. 13, when the second arm 116 moves forward on the first arm 115 in the direction indicated by the arrow and enters a prober chamber 201 through an opening 201A, the second arm 116 is tilted downward by the weight of the probe card C.

(d) When the operator manipulates the manipulation handle 121 of the tilt prevention mechanism 120, the lever member 122 rotates clockwise (the direction of an arrow A in FIG. 14). The abutting member 123 abuts against the front end portion of the lower surface of the first arm 115, and lifts the first arm 115 upward until it is horizontal.

(e) In this state, the lever member 122 is locked where it is by a mechanism (not shown).

(f) The probe card C is set horizontal by this operation.

(g) After the probe card C is mounted, the lever member 122 is unlocked, the first arm 115 which has been supported by the abutting member 123 is released, and the transporting mechanism 112 is restored.

As has been described above, according to this embodiment, the tilt prevention mechanism 120 prevents a tilt of the transporting mechanism 112 which has moved forward from the truck 111. Assume that the second arm 116 of the transporting mechanism 112 enters the prober 200 and that the transporting mechanism 112 is tilted by the weight of the probe card C which is particularly heavy. Even in this case, the tilt prevention mechanism 120 lifts the probe card C upward and corrects it horizontally. The probe card C can be transferred smoothly, and the transporting mechanism 112 need not have high rigidity. Rather, the transporting mechanism 112 can be made lightweight.

The present invention is not limited to the above embodiments at all, and the design of the respective constituent elements can be changed when necessary. For example, as the connecting mechanism 22C of the position fixing mechanism 22, the connecting mechanism 34 of the connection manipulating mechanism 30, and the like, various types of mechanisms can be used. The engaging elements 52 and to-be-engaged elements 53 of the fixing mechanism 50 can take other shapes. As the air cylinder 60 or the like, a driving mechanism other than an air cylinder can be employed.

According to the embodiments of the present invention, the footprint of the prober can be decreased. A large probe card can be maintained in the parallel state in the prober without being adversely affected by a tilt of the floor surface or the like. The probe card can be smoothly transported to the head plate, and can be attached to and detached from it.

What is claimed is:

1. A movable probe card transporting apparatus for transporting a probe card to/from a prober, comprising:

a movable truck;

a transporting mechanism arranged above the truck to be able to separate from and come into contact with the truck, the transporting mechanism including a base and an arm mechanism which is arranged on the base to be movable forward/backward;

a first aligning mechanism to arrange the probe card transported by the transporting mechanism at a predetermined position in the prober, the first aligning mechanism being arranged on at least one of the base and prober; and a second aligning/fixing mechanism to align the base with and fix the base to the prober.

2. A movable probe card transporting apparatus according to claim 1, further having a connection manipulating mechanism which connects the truck to the prober.

3. A movable probe card transporting apparatus according to claim 1, further having a first aligning/fixing mechanism which aligns the transporting mechanism with and fixes the transporting mechanism at a reference position on the truck.

4. A movable probe card transporting apparatus according to claim 3, wherein the first aligning/fixing mechanism has an elastic member which pulls the transporting mechanism toward the truck.

5. A movable probe card transporting apparatus according to claim 1, wherein the transporting mechanism is placed on a lower plate, and the lower plate has a first slide mechanism on a lower surface thereof, and the truck has an upper plate on an upper surface thereof, and the upper plate has a second slide mechanism on an upper surface thereof, the first slide mechanism being slidable on the second slide mechanism.

6. A transporting apparatus according to claim 5, wherein the first and second slide mechanisms are plate-like members, and at least one surface of the plate-like member of each of the first and second slide mechanisms is formed of a low-friction material.

7. A movable probe card transporting apparatus according to clam 1, wherein the arm mechanism has a first arm mechanism which can move forward/backward on the base, and a second arm mechanism which can move forward/backward on the first arm mechanism.

8. A movable probe card transporting apparatus according to clam 1, having a mechanism that prevents the transporting mechanism, which has moved forward from the truck, from tilting.

* * * * *